United States Patent [19]
Ikeda et al.

[11] Patent Number: 5,901,345
[45] Date of Patent: May 4, 1999

[54] TRANSMITTER OF WIRELESS SYSTEM AND HIGH FREQUENCY POWER AMPLIFIER USED THEREIN

[75] Inventors: Hikaru Ikeda, Yokohama; Hiroaki Kosugi, Hirakata; Kaoru Ishida, Shijonawate; Nobuo Fuse, Moriguchi; Hideki Yagita; Hiroshi Haruki, both of Yokohama, all of Japan

[73] Assignee: Matsushita Electric Industrial Co., Ltd.

[21] Appl. No.: 09/056,446

[22] Filed: Apr. 6, 1998

Related U.S. Application Data

[62] Division of application No. 08/705,244, Aug. 30, 1996, Pat. No. 5,770,970.

[30] Foreign Application Priority Data

Aug. 30, 1995 [JP] Japan .................................. 7-221335

[51] Int. Cl.[6] ............................. H04B 1/04; H03F 3/60; H03F 3/68
[52] U.S. Cl. ..................... 455/114; 455/107; 455/127; 455/129; 330/295
[58] Field of Search ..................................... 455/127, 129, 455/114, 115, 90, 107; 375/296, 297; 330/286, 295, 302, 53, 124 R, 310, 54, 277; 333/124, 32

[56] References Cited

U.S. PATENT DOCUMENTS

| 4,477,781 | 10/1984 | Reuss, Jr. . |  |
| --- | --- | --- | --- |
| 4,803,443 | 2/1989 | Takagi et al. . |  |
| 4,930,035 | 5/1990 | Viana et al. | 455/287 |
| 5,055,798 | 10/1991 | Heinzelmann . |  |
| 5,335,368 | 8/1994 | Tamura | 455/90 |
| 5,423,074 | 6/1995 | Dent | 455/127 |
| 5,661,434 | 8/1997 | Brozovich et al. . |  |
| 5,770,970 | 6/1998 | Ikeda et al. | 300/286 |
| 5,778,308 | 7/1998 | Sroka et al. | 455/115 |

*Primary Examiner*—Nguyen Vo
*Attorney, Agent, or Firm*—Ratner & Prestia

[57] ABSTRACT

The output of a digital modulator is put into a power amplifying device, is distributed into n pieces in an n-power divider in the power amplifier, passes through n input phase shifters differing individually in the phase change amount, is amplified by n power amplifiers, passes through n output phase shifters to match the phase of n signals, is combined in an n-power combiner, and is issued from an output terminal to a phase shifter, and the output of the phase shifter is issued to a transmission antenna. Herein, the phase value of the phase shifter is determined so as to extend the region of the output load impedance for satisfying the specific value of unwanted radiation, and so that the output load impedance range of the load impedance of the power amplifier may be optimize to the impedance change range of the trans missionantenna, thereby eliminating the isolator and presenting a transmitting device of a portable wireless system realizing smaller size, higher performance, and lower cost of portable wireless system.

10 Claims, 15 Drawing Sheets

TRANSMITTER OF WIRELESS SYSTEM AND HIGH FREQUENCY POWER AMPLIFIER USED THEREIN

This application is a divisional of application Ser. No. 08/705,244, filed Aug. 30, 1996, U.S. Pat. No. 5,770,970.

FIELD OF THE INVENTION

The present invention relates to a transmitter of wireless system mainly used in digital cellular phone or the like, and a high frequency power amplifier used therein.

BACKGROUND OF THE INVENTION

Recently, the demand for cellular phone is mounting and the digitizing trend is dominating for effective utilization of frequency, and smaller size and lower cost are highly requested, and in this respect, in particular, the conventional digital cellular phones have many problems to be solved. Referring now to a drawing, an example is explained about the transmitter of cellular phone for portable use of digital modulation in the above prior art.

FIG. 1 shows a block diagram of a transmitter of a digital cellular phone in prior art. In FIG. 1, a digital modulator 204 is connected to a power amplifier 203, and is connected to a transmission antenna 201 through an isolator 202.

In the transmitter of the digital cellular phone of the prior art thus constituted, its operation is described below. A high frequency signal modulated by the digital modulator 204 is amplified by the power amplifier 203, and is transmitted from the antenna 201 through the isolator 202.

In such constitution of the prior art, however, in the cellular phone using digital modulation of quarter-pi-shifted QPSK, CDMA or the like, in order to control the adjacent channel leakage power which is unwanted radiation included in the signal sent out from the antenna 201 below the value specified in Radio Wave Law, it is required to keep constant the output load impedance of the power amplifier 203. The isolator 202 is designed to transmit the signal almost without attenuation in one direction, and absorb the opposite direction signal, and thereby it acts so as not to reflect the impedance change of the antenna 201 to the power amplifier 203. In the transmitter of the conventional digital cellular phone, to prevent increase of unwanted radiation due to fluctuation of load impedance of the high frequency power amplifier, it needed an expensive and large isolator with a large transmission loss.

SUMMARY OF THE INVENTION

The invention is devised to solve the above problems of the prior art, and it is an object thereof to present a transmitting device of wireless machine capable of preventing increase of unwanted radiation without using expensive and large isolator with a large transmission loss, and a high frequency power amplifier used therein.

To achieve the object, the basic constitution of the transmitter of the wireless machine of the invention comprises a phase shifter inserted against the transmission antenna so that the output load impedance of the power amplifier including the antenna impedance may be optimum for the power amplifier, thereby minimum in distortion.

By adjusting the phase value of this phase shifter, the load impedance including the transmission antenna of the power amplifier is optimized, the distortion in operation is decreased, and the unwanted radiation may be minimum.

This constitution is further expanded into a constitution comprising a power amplifier for synthesizing the outputs of plural power amplifiers individually different in the phase of the output load impedance.

In such constitution, the invention can expand the region of the output load impedance for satisfying the value of the specified unwanted radiation, by synthesizing plural power amplifiers individually differing in the phase of output load impedance.

As other means for achieving the object, the constitution may comprise a power amplifier using a final stage transistor which has a large output power at gain 1 dB gain compression point than the power of adding gain Gp in 1 dB gain comression point of the final stage transistor to the output power at 1 dB gain compression point of the first stage transistor.

In this constitution, too, it is effective to decrease the distortion of the power amplifier and minimize the unwanted radiation.

Also in this constitution, in order that the output load impedance of the poser amplifier including the antenna impedance may be optimum for the power amplifier, a phase shifter may be inserted against the transmission antenna, and hence the expected effects may be further enhanced.

Thus, the invention is capable of achieving the region of the output load impedance for minimizing the distortion of the power amplifying device and satisfying the desired unwanted radiation value without using isolator.

EMBODIMENTS

In the following description of embodiments of the invention, examples of cellular phone using digital modulation are presented.

Figure 1:
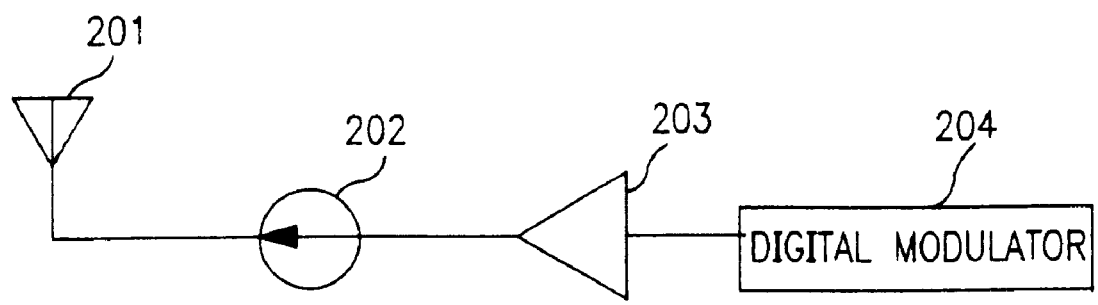
FIG. 1 is a block diagram of a transmitter of a digital cellular phone in prior art.
Figure 2:
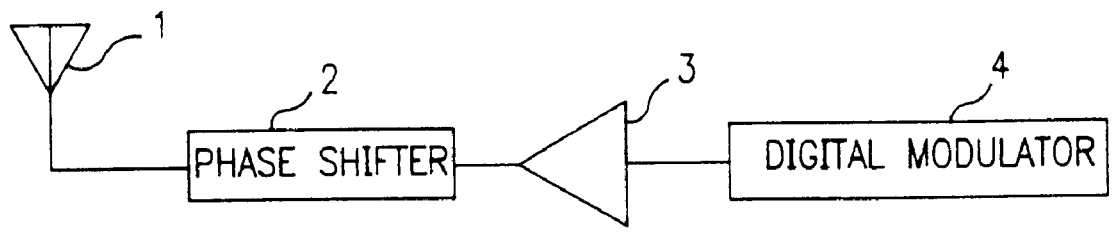
FIG. 2 is a block diagram of a transmitter of a digital cellular phone in a first embodiment of the invention.

A transmitter of a digital cellular phone in a first embodiment of the invention is described below while referring to the drawings. FIG. 2 is a block diagram of the transmitter of the digital cellular phone showing the first embodiment of the invention. In FIG. 2, a digital modulator 4 is connected to a power amplifier 3, and is further connected to a transmission antenna 1 through a phase shifter 2.

In thus constituted transmitter of the digital portable cellular phone, the operation is described below. First, the impedance of the antenna 1 varies with the state of use of the cellular phone. For example, when placed in a free space, when held in hand during call, or when put on a desk, the impedance of the antenna 1 varies. The range of change of the impedance of the antenna 1 changed in the state of use of the cellular phone is shown in shaded area in FIG. 3. It is known from FIG. 3 that the impedance of the antenna is shifted to one phase direction.

Figure 4:
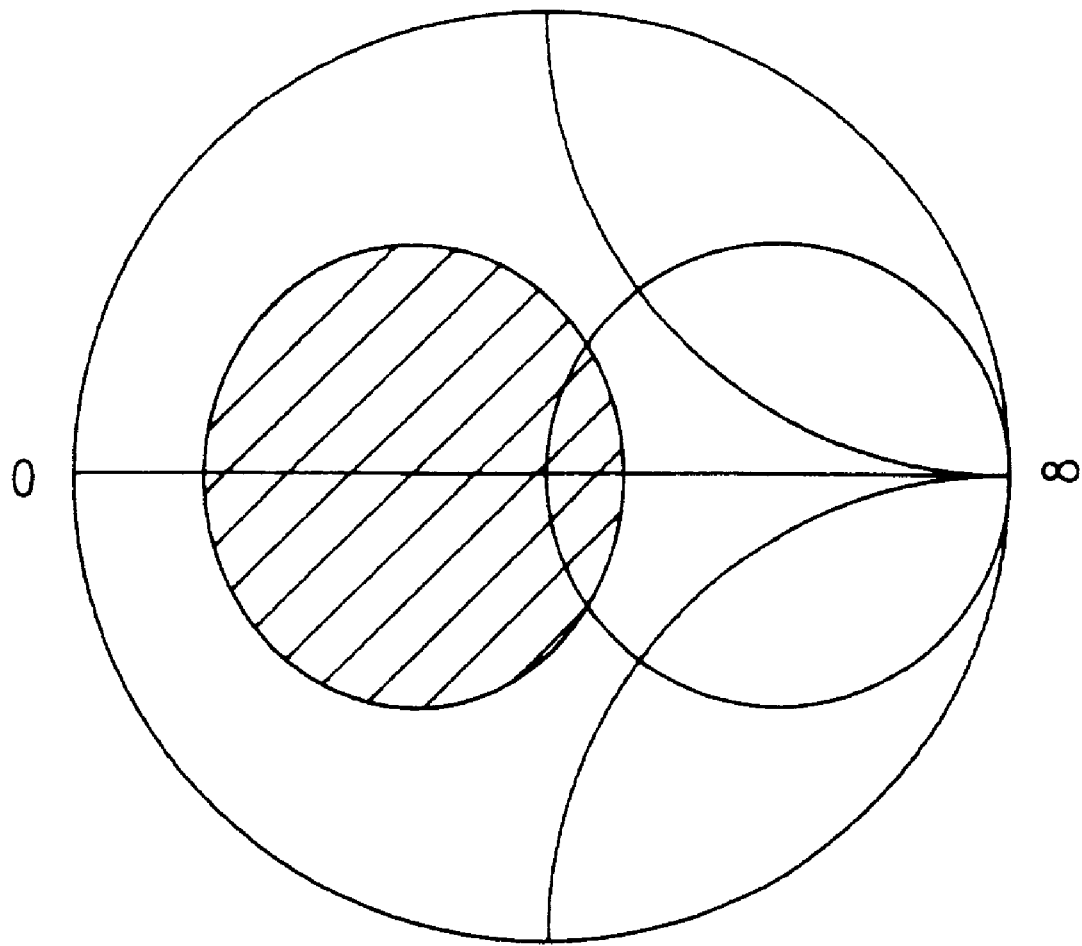
FIG. 4 is an output load impedance characteristic diagram for satisfying the specified value of unwanted radiation of a high frequency power amplifier in the transmitter of the digital cellular phone in the first embodiment of the invention.

The power amplifier using digital modulation such as quarter-pi shifted QPSK and CDMA changes in the distortion of the amplifier when the output load impedance is variable, and hence varies in the value of the unwanted radiation (especially adjacent channel leakage power) depending on its change. FIG. 4 shows the output load impedance range for satisfying the value of unwanted radiation of the power amplifier. It is clear from FIG. 4 that the output load impedance for satisfying the value of unwanted radiation of the power amplifier is shifted to a certain phase direction.

Figure 3:
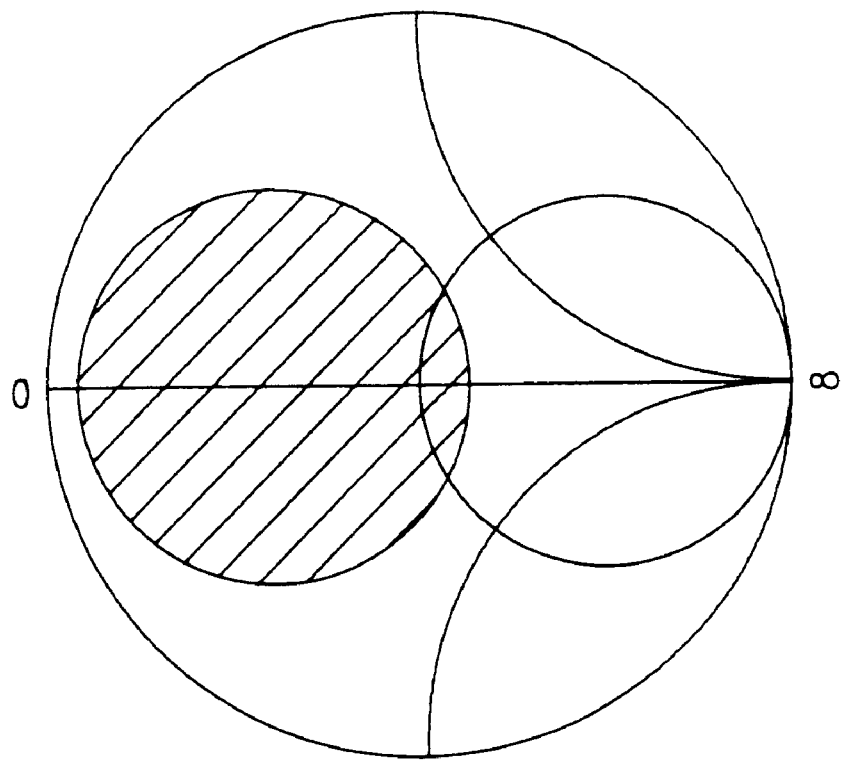
FIG. 3 is an antenna impedance characteristic diagram of various states of use of the transmitter of the digital cellular phone in the first embodiment of the invention.

These results are applied to the transmitter of the digital cellular phone in FIG. 2, That is, when the high frequency signal modulated by the digital modulator 4 is amplified by the power amplifier 3, and transmitted from the transmission antenna 1 through the phase shifter 2, the phase value of the phase shifter 2 is adjusted and set so that the impedance change range of the transmission antenna 1 as shown in FIG. 3 may be converted into the output load impedance range for satisfying the value of unwanted radiation for the power amplifier 3.

By setting of the phase value of the phase shifter 2 alone, the impedance change range of the antenna shown in FIG. 3 may not be sufficiently fitted within the output load impedance range of the power amplifier shown in FIG. 4. In this case, as the power amplifier, it is necessary to use one of wide output load impedance range for satisfying the value of unwanted radiation. To broaden the output load impedance range for satisfying the value of unwanted radiation, by using the power amplifier of transistor which has a larger output power, the distortion in use may be smaller and hence the unwanted radiation may be smaller, so that the output load impedance range for satisfying the value of the unwanted radiation may be broader.

Thus, according to the embodiment, by optimizing the phase value of the phase shifter inserted between the power amplifier and transmission antenna, the isolator can be omitted, and the cellular phone may be smaller in size, higher in performance, and lower in cost.

Figure 5:
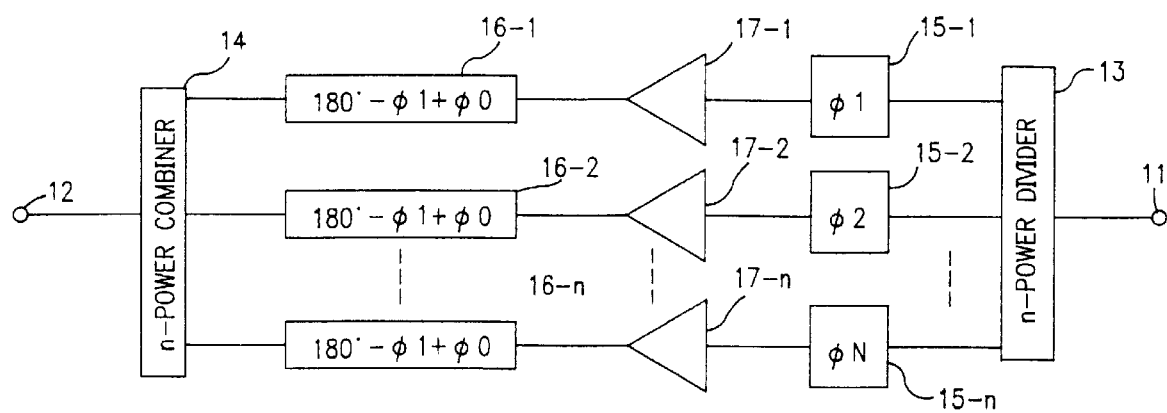
FIG. 5 is a block diagram of a high frequency power amplifier in a transmitter of a cellular phone in a second embodiment of the invention.

A second embodiment of the invention in described below by referring to the drawings. FIG. 5 is a block diagram of a high frequency power amplifier of a transmitter of a digital cellular phone in the second embodiment of the invention. In FIG. 5, an input terminal 11 is connected to one input of an n-power divider 13 having n outputs of same phase change amount for one input, and n input phase shifters 15-1 to 15-n individually different in phase change amount are connected to n outputs of the n-power divider 13.

Furthermore, to the outputs of then input phase shifters 15-1 to 15-n, output phase shifters 16-1 to 16-n are connected through n power amplifiers 17-1 to 17-n having same characteristics. The outputs of n output phase shifters 16-1 to 16-n are connected to n inputs of an n-power combiner 14 having one output of same phase change amount for n inputs, and one output of the n-power combiner is connected to an output terminal 12.

Herein, the n output phase shifters 16-1 to 16-n are set so that the phase change amounts may be individually (180°−$\phi1+\phi0$), (180°−$\phi2+\phi0$), ..., (180°−$\phi n+\phi0$), supposing the phase change amounts of the n input phase shifters 15-1 to 15-n to be $\phi1, \phi2, \ldots, \phi n$ and fixed phase amount to be $\phi0$.

In thus constituted high frequency power amplifier of the transmitter of the digital cellular phone of the second embodiment, the operation is described below. First, the high frequency signal entering the input terminal 11 is splitted into n pieces in the n-power divider 13, passes through the n input phase shifters 15-1 to 15-n individually differing in the phase change amount, and is amplified by n power amplifiers 17-1 to 17-n. It further passes through n output phase shifters 16-1 to 16-n for matching the phases of n signals by the input of the n-power combiner 14, and is combined in the n-power combiner 14, and issued from the output terminal 12.

Figure 6B:
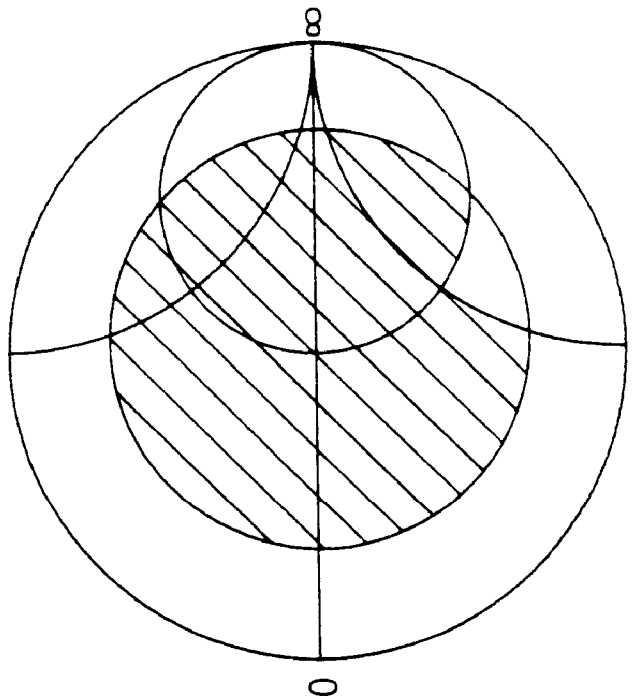
FIG. 6 is an output load impedance characteristic diagram of the high frequency power amplifier in the second embodiment of the invention.
Figure 6A:
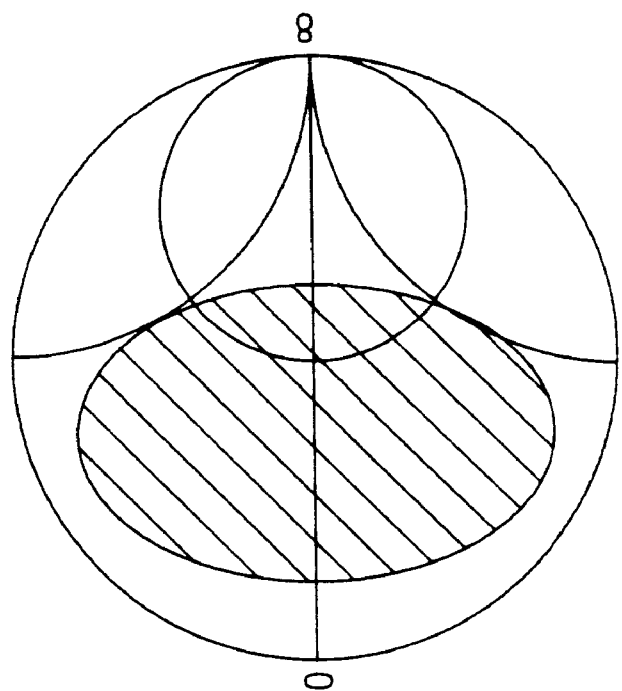

Then, as shown in FIG. 4, in the power amplifiers 17-1 to 17-n, the output load impedance for satisfying the value of unwanted radiation is shifted to a certain impedance direction. Hence, by individually varying the phases of the output load impedances of the power amplifiers 17-1 to 17-n, and combining them, the region of the output load impedance for satisfying the value of the unwanted radiation my be extended as shown in FIG. 6a and FIG. 6b.

Thus, according to this embodiment, by synthesizing the outputs of the plural power amplifiers having output phase shifters individually differing in the phase of the output load impedance, it presents a high frequency power amplifier for expanding the region of the output load impedance for satisfying the value of unwanted radiation specified.

In such constitution, it is preferred that the load impedance of all power amplifiers of the plural power amplifiers may satisfy the value of the unwanted radiation, but if at least one power amplifier is set in a preferred load state, the distortion in the overall entire output can be lowered.

Herein, the high frequency power amplifier is defined to include input phase shifter, power amplifier, output phase shifter and all others ranging from the power divider to the power combiner.

Figure 7:
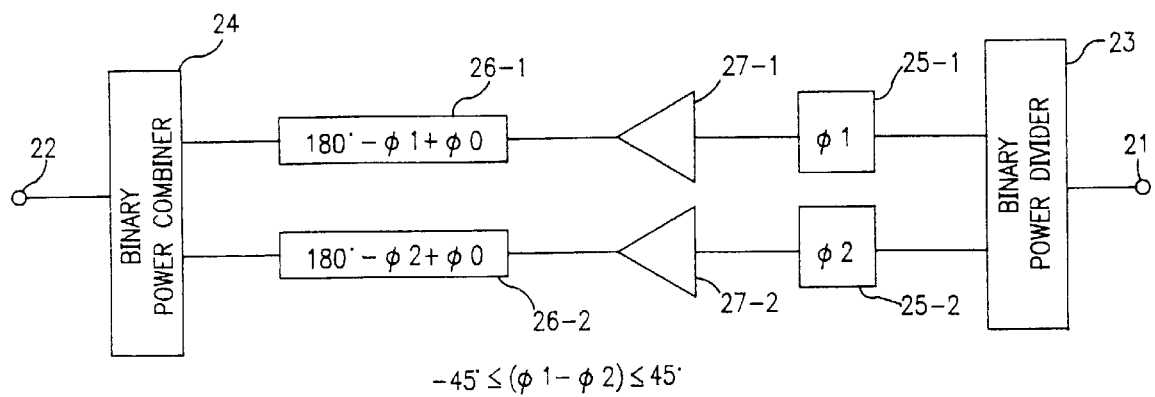
FIG. 7 is a block diagram of a high frequency power amplifier in a transmitter of a cellular phone in a third embodiment of the invention.

A third embodiment of the invention is described below by referring to the drawings. FIG. 7 is a block diagram of a high frequency power amplifier according to the third embodiment of the invention. In FIG. 7, an input terminal 21 is connected to a binary power divider 23 having two outputs of same phase change amount for one input, and two outputs of the binary power divider 23 are connected to input phase shifters 25-1 and 25-2 of which difference in phase change amount is $(-45° \leq (\phi1-\phi2) \leq 45°)$, supposing individual phase change amounts to be $\phi1$ and $\phi2$. Further, the two input phase shifters 25-1 and 25-2 are connected to two output phase shifters 26-1 and 26-2, of which phase change amounts are respectively $(180°-\phi1+\phi0)$ and $(180°-\phi2+\phi00)$, supposing the fixed phase amount to be $\phi0$, through power amplifiers 27-1 and 27-2 having same characteristics. The two output phase shifters 26-1 and 26-2 are respectively connected to two inputs of a binary power combiner 24 having one same phase change amount for two inputs, and one output of the binary power combiner 24 is connected to an output terminal 22.

In thus constituted high frequency power amplifier of the third embodiment, the operation is described below. First, a high frequency signal entering the input terminal 21 is divided into two pieces in the binary power divider 23, passes through the input phase shifters 25-1 and 25-2 differing in the phase change amount, and is amplified by the power amplifiers 27-1 and 27-2. Further passing through the output phase shifters 26-1 and 26-2 for matching the phase of two signals by the inputs of the binary power combiner 24, it is conbined in the binary power combiner 24 and is issued through the output terminal 22.

Figure 8:
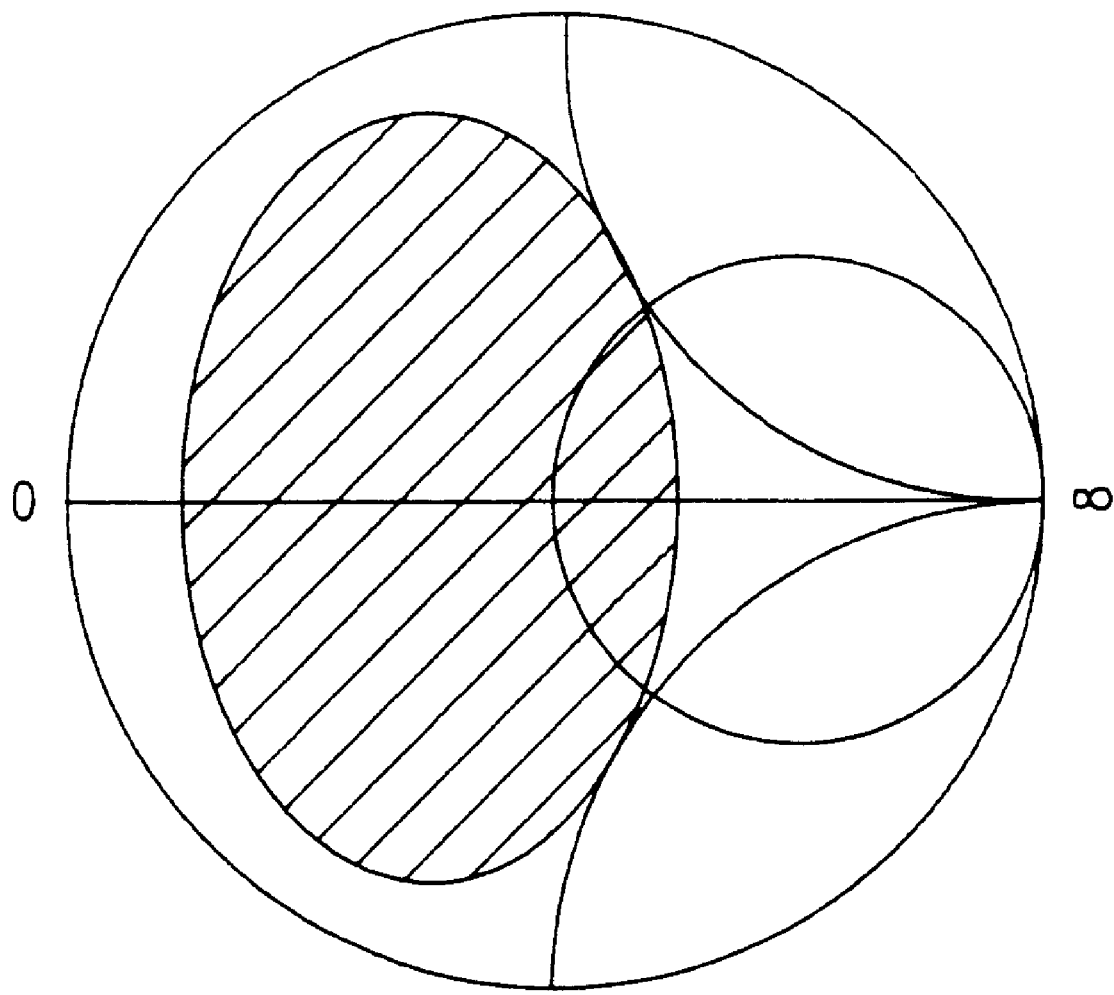
FIG. 8 is an output load impedance characteristic diagram of the high frequency power amplifier in the transmitter of the cellular phone in the third embodiment of the invention.

Thus, in the power amplifiers 27-1 and 27-2, as shown in FIG. 4, since the output load impedance for satisfying the value of unwanted radiation is shifted in a certain impedance direction, by varying the phases of the output load impedances of the two power amplifiers 27-1 and 27-2 individually $(-45° \leq (\phi1-\phi2) \leq 45°)$, the region of the output load impedance for satisfying the value of unwanted radiation may be extended as indicated by shaded area in FIG. 8.

Thus, according to the embodiment, by combining the powerby setting the phases of the output load impedances of the two power amplifiers to be $(-45° \leq (\phi1-\phi2) \leq 45°)$, the region of the output load impedance for satisfying the value of unwanted radiation can be extended.

Figure 9:
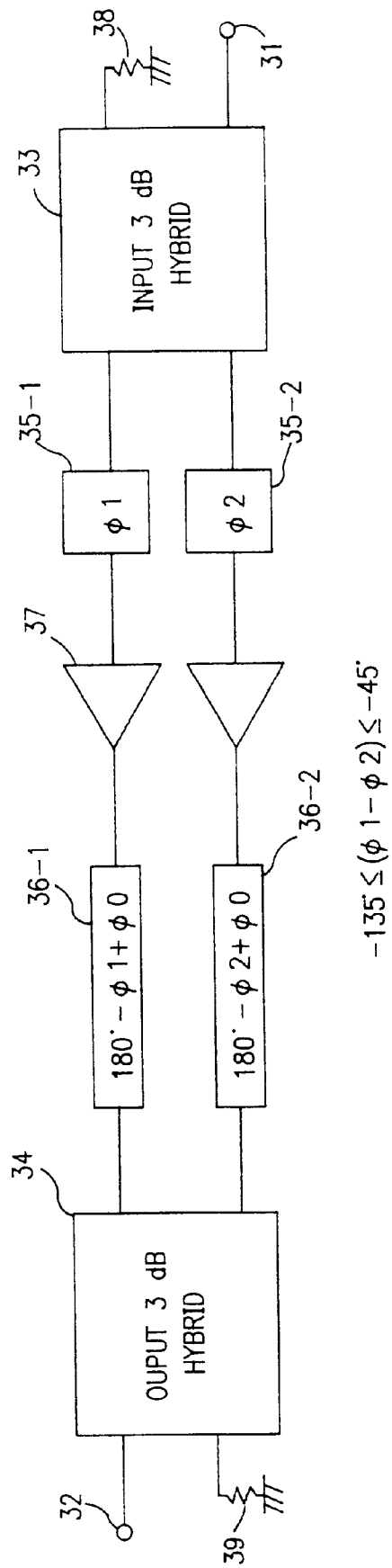
FIG. 9 is a block diagram of a high frequency power amplifier in a transmitter of a cellular phone in a fourth embodiment of the invention.

A fourth embodiment of the invention is described below by referring to the drawings. FIG. 9 is a block diagram of a high frequency power amplifier in the fourth embodiment of the invention. In FIG. 9, one terminal of an input 3 dB hybrid 33 is connected to an termination resistance 38, and other terminal is connected to an input terminal 31. Two output terminals of the input 3 dB hybrid 33 differ in the phase change amount to the input terminal by 90°, and therefore one output terminal with 90° phase difference is connected to an input phase shifter ($\phi1$) 35-1, and the other is connected to an input phase shifter ($\phi2$) 35-2.

Moreover, the outputs of the two input phase shifters 35-1 and 35-2 are connected to two output phase shifters 36-1 and 36-2 of which phase change amounts are respectively $(180°-\phi1+\phi0)$ and $(180°-\phi2+\phi0)$, supposing the fixed phase amount to be $\phi0$. One terminal of an output 3 dB hybrid 34 is connected to termination resistance 3 9, and other terminal is connected to an output terminal32. Two input terminals of the output 3 dB hybrid 34 differ in the phase change amount to the output terminal by 90°, and hence an input terminal having a phase change of 90° is connected to an output phase shifter $(18°-\phi2+\phi0)$ 36-2, and the other is connected to an output phase shifter $(180°-\phi1+\phi0)$ 36-1. In these two input phase shifters 35-1 and 35-2, supposing the phase change amounts to be $\phi1$ and $\phi2$, the difference of the phase change amount is $(-135° \leq (\phi1-\phi2) \leq -45°)$.

In thus constituted high frequency power amplifier, the operation is described below. First, a high frequency signal entering the input terminal 31 is divided into two pieces in the input 3 dB hybrid 33, and passes through the input phase shifters 35-1 and 35-2 individually differing in the phase change amount, and is amplified in the power amplifiers 37-1 and 37-2. Further passing through the output phase shifters 36-1 and 36-2 for matching the phase of two signals by the inputs of the output 3 dB hybrid 34, it is combined in the output 3 dB hybrid 34 and is issued through the output terminal 32.

Thus, in the power amplifiers 37-1 and 37-2, as shown in FIG. 4, since the output load impedance for satisfying the value of unwanted radiation is shifted in a certain impedance direction, considering the phase change amount of the output 3 dB hybrid 34 and the phases of the output phase shifters, the phases of the output load impedances of the two power amplifiers37-1 and 37-2 individually different $(-45° \leq (\phi1-\phi2) \leq 45°)$, and therefore the region of the output load impedance for satisfying the value of unwanted radiation may be extended as indicated by shaded area in FIG. 8. Moreover, by using the 3 dB hybrid, the impedance matching of seeing the inside of the high frequency amplifying device from the input terminal 31 and output terminal 32 is improved.

Thus, according to the embodiment, by synthesizing the power by setting the phases of the output load impedances of the two power amplifiers to be $(-45° \leq (\phi1-\phi2) \leq 45°)$, the region of the output load impedance for satisfying the value of unwanted radiation can be extended, and also the input to output impedance of the entire power amplifier can be improved.

Figure 10:
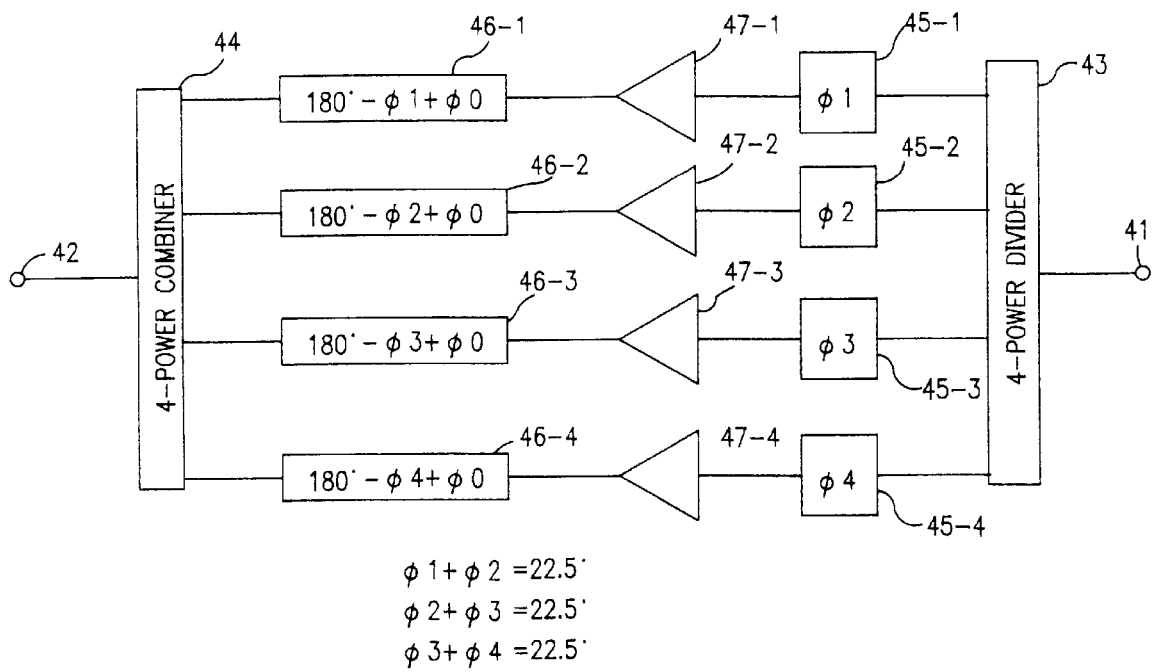
FIG. 10 is a block diagram of a high frequency power amplifier in a transmitter of a cellular phone in a fifth embodiment of the invention.

A fifth embodiment of the invention is described below while referring to the drawings. FIG. 10 is a block diagram of a high frequency power amplifier in the fifth embodiment of the invention. In FIG. 10, an input terminal 41 is connected to one input of a 4-splitter 43 having four outputs of same phase change amount for one input, and input phase shifters 45-1 to 45-4 are connected to four outputs of the 4-splitter 43. Moreover, output phase shifter 46-1 to 46-4 are connected to the outputs of the four input phase shifters 45-1 to 45-4 through four power amplifiers 47-1 to 47-4 having same characteristics. The outputs of the four output phase shifters 46-1 to 46-4 are connected to four inputs of a 4-combiner 4 4 having one output of same phase change amount for four inputs, and one output of the 4-combiner is connected to an output terminal 42. Herein, supposing the phase change amounts of the four input phase shifters 45-1 to 45-4 to be respectively $\phi1$, $\phi2$, $\phi3$, and $\phi4$, the difference of the phase amount is respectively 22.5 degrees. In the four output phase shifters46-1 to 46-4, supposing the fixed phase amount to be $\phi0$, the phase change amounts are respectively $(180°-\phi1+\phi0)$, $(180°-\phi2+\phi0),(180°-\phi3+\phi0)$, and $(180°-\phi4+\phi0)$.

In thus constituted high frequency power amplifier, the operation is described below. First a high frequency signal entering the input terminal 41 is divided into four pieces in the 4-splitter 43, passes through the input phase shifters 45-1 to 45-4 differing in the phase change amount, and is amplified by the power amplifiers 47-1 to 47-4. Further passing through the output phase shifters 46-1 to 46-4 for matching the phase of four signals by the inputs of the quarter power combiner 44, it is combined in the quarter power combiner 44 and is issued through the output terminal 42.

Thus in the power amplifiers 47-1 to 47-4, as shown in FIG. 4, since the output load impedance for satisfying the value of unwanted radiation is shifted in a certain impedance direction, by varying the phases of the output load impedances of the four power amplifiers 47-1 to 47-4 by 22.5° each, the region of the output load impedance for satisfying the value of unwanted radiation may be extended in all phase direction as shown in FIG. 6 (b).

Thus, according to the embodiment, by synthesizing the power by setting the phases of the output load impedances of the four power amplifiers to be different by 22.5° each, the region of the output load impedance for satisfying the value of unwanted radiation can be extended.

Figure 11:
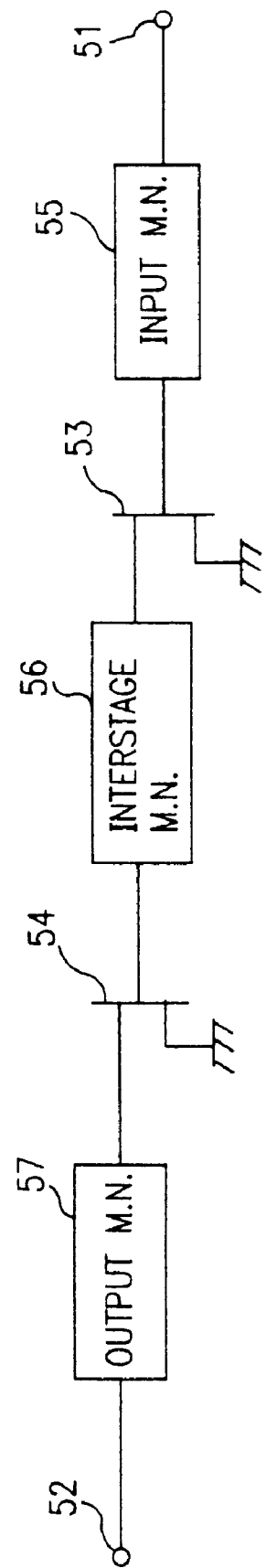
FIG. 11 is a block diagram of a high frequency power amplifier in a transmitter of a cellular phone in a sixth embodiment of the invention.

A sixth embodiment of the invention is described below by referring to the drawings. FIGS. 11 is a block diagram of a high frequency power amplifier in the sixth embodiment of the invention. In FIG. 11, an input terminal 51 is connected to the input of an input matching circuit 55, the output of the input matching circuit 55 is connected to the input of a first stage transistor 53, the output of the first stage transistor 53 is connected to the input of a final stage transistor 54 through an interstate matching circuit 5 6, the output of the final stage transistor 54 is connected to the input of an output matching circuit 57, and the output of the output matching circuit 57 is connected to an output terminal 52.

In thus constituted high frequency power amplifier, the operation is described below. First, a high frequency signal entering the input terminal 51 passes through the input matching circuit 55, is amplified in the first stage transistor 53, passes through the interstage matching circuit 56, is amplified in the final stage transistor 54, passes through the output matching circuit 57, and is issued from the output terminal 52.

Figure 12:
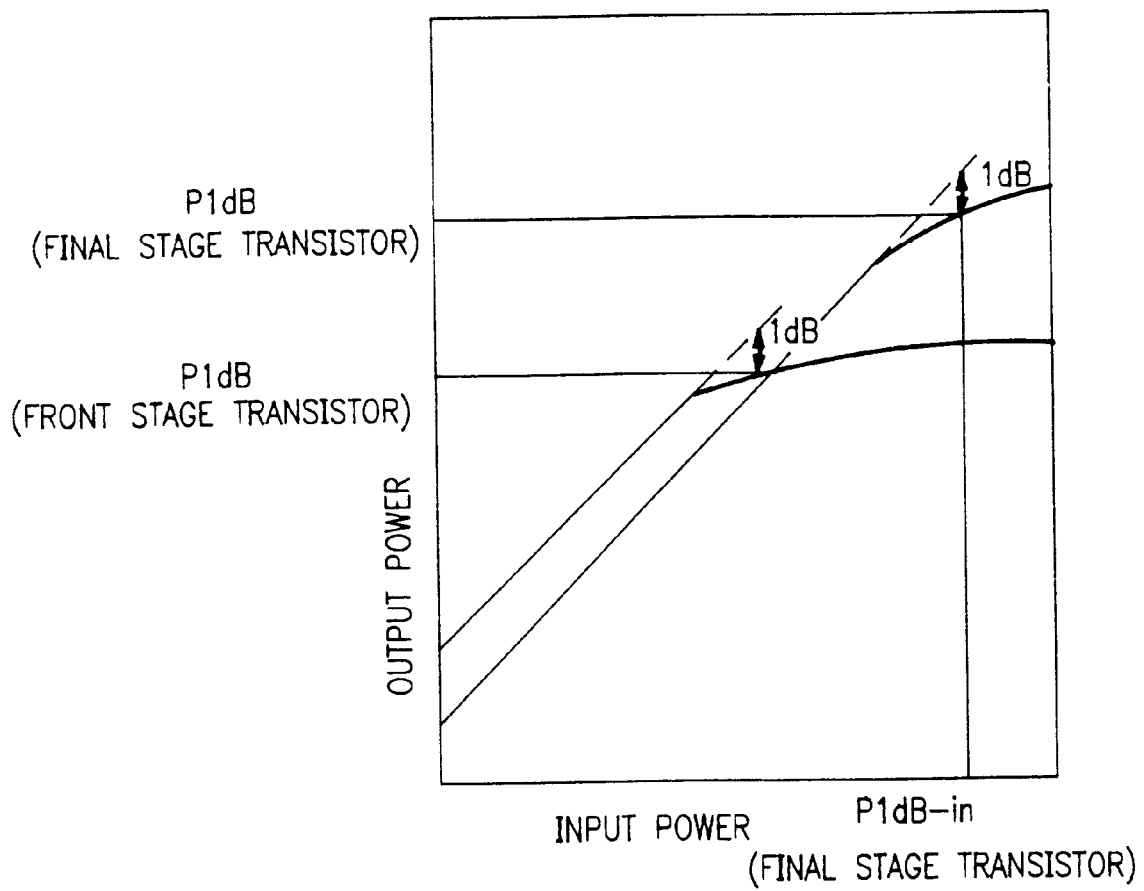
FIG. 12 is an input to output characteristic of a first stage transistor and final stage transistor in the transmitter of the cellular phone in the sixth embodiment of the invention.

The input to output characteristics of the first stage transistor 53 and final stage transistor 54 are shown in FIG. 12. In FIG. 12, supposing the gain of the final stage transistor 54 at 1 dB gain compression point (the point of 1 dB compression of gain due to saturation of the output power) to be Gp, the final stage transistor 54 is selected so that it has a lager output power at 1 dB gain compression point than the power of adding gain Gp to the output power at 1 dB gain compression point of first stage transistor 53.

Figure 13:
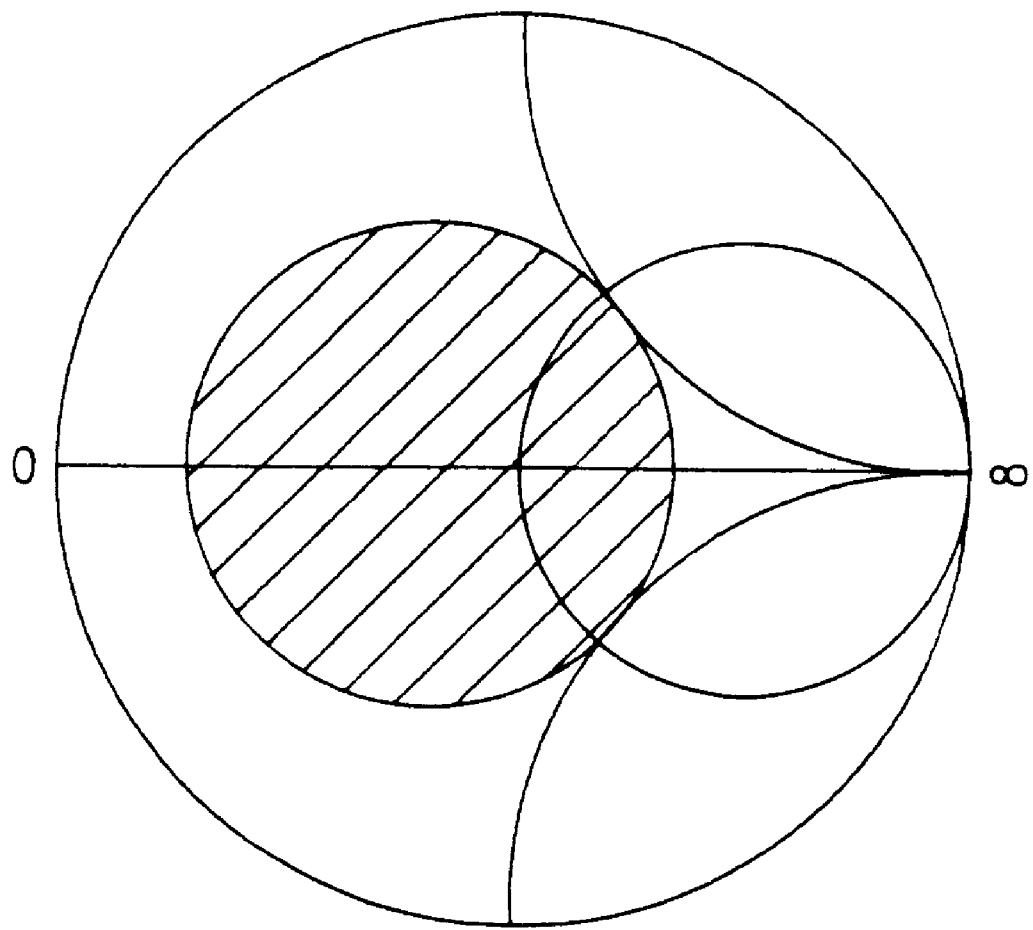
FIG. 13 is an output load impedance characteristic device of the amplifier in the sixth embodiment of the invention.

In this constitution, as the final stage transistor, a transistor larger in output power than the final stage transistor in the conventional amplifier constitution is used. Incidentally, the greater the difference between the maximum output and usual output of the transistor, the wider can be extended, as shown in FIG. 13, the range of the output load impedance satisfying the value of unwanted radiation. However, the transistor of a larger output power is generally poor in the DC to AC power efficiency, the transistors before the final stage are same as in the conventional transistor constitution.

Thus, according to the embodiment, in the applicable frequency band, supposing the gain at 1 dB gain comression point of the final stage transistor to be Gp, by selecting the input to output power characteristics of the transistors so that it has a lager output power at 1 dB gain compression point than the power of adding gain Gp to the output power at 1 dB gain compression point of first stage transistor 53, that is, so that the final stage transistor may not be saturated before the first stage transistor is saturated, the region of the output load impedance for satisfying the value of unwanted radiation can be extended.

Figure 14:
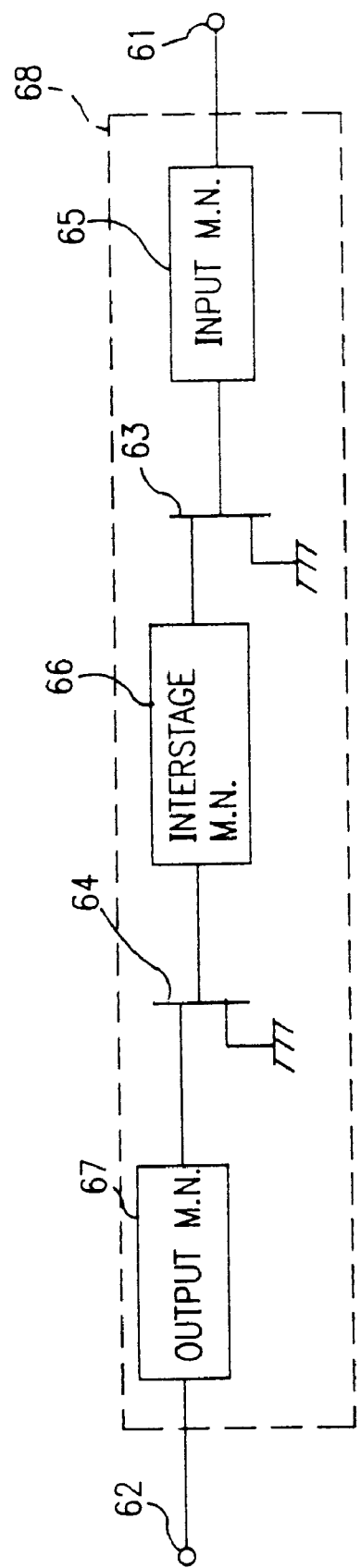
FIG. 14 is a block diagram of a high frequency power amplifier in a transmitter of a cellular phone in a seventh embodiment of the invention.

A seventh embodiment of the invention is described below while referring to the drawing. FIG. 14 is a block diagram of a high frequency power amplifier in the seventh embodiment of the invention. In FIG. 14, an input terminal 61 in connected to the input of an input matching circuit 65, the output of the input matching circuit 65 is connected to the input of a first stage transistor 63, the output of the first stage transistor 63 is connected to the input of a final stage transistor 64 through an interstage matching circuit 66, the output of the final stage transistor 64 is connectedto the input of an output matching circuit 67, and the output of theoutput matching circuit 67 is connected to output terminal 62. The constitution in the block diagram is same as in FIG. 11 relatingto the sixth embodiment, except that the area enclosed by broken line 68 is composed of a monolithic microwave integrated circuit (MMIC).

The operation of the embodiment is same as in the sixth embodiment shown in FIG. 11. According to the embodiment, in the applicable frequency band supposing the gain at 1 dB gain comression point of the final stage transistor to be Gp, by selecting the input to output power characteristics of the transistors so that it has a lager output power at 1 dB gain compression point than the power of adding gain Gp to the output power at 1 dB gain compression point of first stage transistor 53, that is, so that the final stage transistor may not be saturated before the first stage transistor is saturated, the region of the output load impedance for satisfying the value of unwanted radiation can be extended, and moreover it is composed in a smaller size by forming a high frequency monolithic IC.

Figure 15:
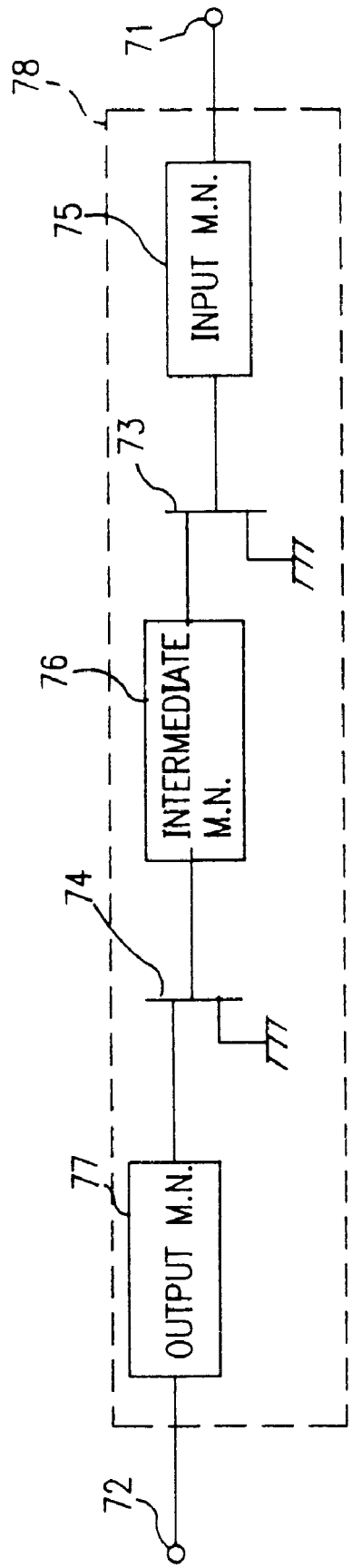
FIG. 15 is a block diagram of a high frequency power amplifier in a transmitter of a cellular phone in an eighth embodiment of the invention.

An eighth embodiment of the invention is described below while referring to the drawing. FIG. 15 is a block diagram of a high frequency power amplifier in the eighth embodiment of the invention. In FIG. 15, an input terminal 71 is connected to the input of an input matching circuit 75, the output of the input matching circuit 75 is connected to the input of a first stage transistor 73, the output of the first stage transistor 73 is connected to the input of a final stage transistor 74 through an interstage matching circuit 75, the output of the final stage transistor 74 is connected to the input of an output matching circuit 77, and the output of the output matching circuit 77 is connected to an output terminal 72. The constitution in the block diagram is same as in FIG. 11 relating to the sixth embodiment, except that the area enclosed by broken line 78 is composed of a monolithic microwave integrated circuit (MMIC).

The operation of the embodiment is same as in the sixth embodiment shown in FIG. 11. According to the embodiment, in the applicable frequency band, supposing the gain at 1 dB gain comression point of the final stage transistor to be Gp, by selecting the input to output power characteristics of the transistors so that it has a lager output power at 1 dB gain compression point than the power of adding gain Gp to the output power at 1 dB gain compression point of first stage transistor 53, that is, so that the final stage transistor may not be saturated before the first stage transistor is saturated, the region of the output load impedance for satisfying the value of unwanted radiation can be extended, and moreover it is composed in a smaller size by forming a high frequency monolithic IC, and further by forming the output matching circuit as an externally fitted matching circuit, the output matching circuit loss is decreased as compared with the high frequency monolithic IC, so that the power amplifying device my be enhanced in efficiency. This is because formation of matching circuit on the high frequency monolithic IC realizes a smaller size, but increases the loss since the line width of the inductance and transmission line becomes thinner and increasing of inductance.

Figure 16:
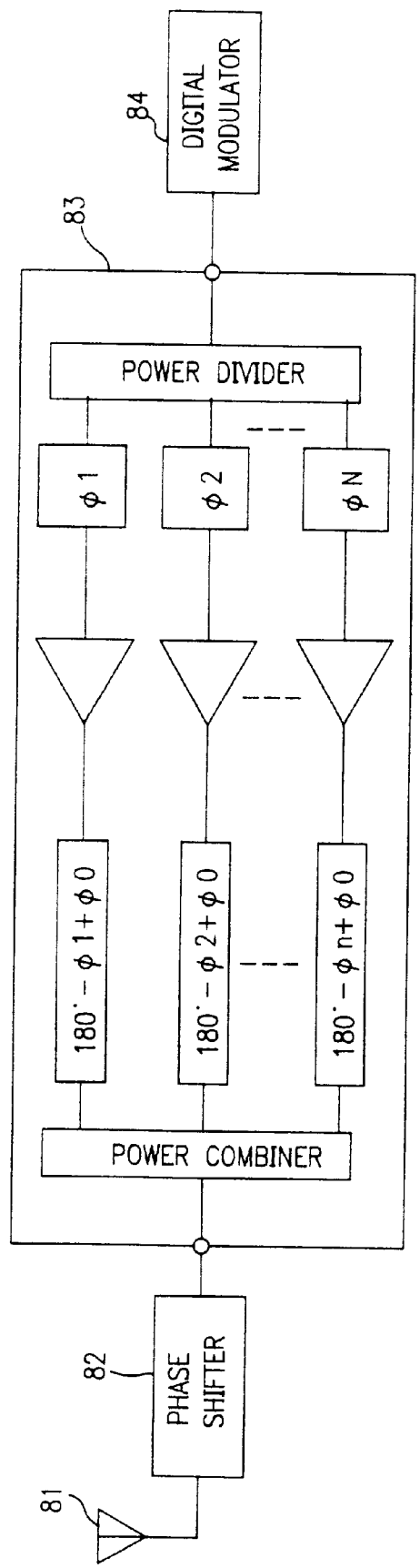
FIG. 16 is a block diagram of a transmitter of a digital cellular phone in any one of ninth to fifteenth embodiments of the invention.

Ninth to fifteenth embodiments of the invention are described below while referring to the drawings. FIG. 16 is a block diagram of a transmitter of a digital portable wireless machine showing any one of the ninth to fifteenth embodiments of the invention. In FIG. 16, the output of a digital modulator 84 is connected to a power amplifier 83. The output of the power amplifier 83 is connected to a transmission antenna 81 through a phase shifter 82. The power amplifier 83 herein is same as the power amplifier in FIG. 5, and it is the power amplifying device extended in the region of output load impedance for satisfying the value of unwanted radiation by the means as shown in FIGS. 5, 7, 9, 10, 11, 14, and 15 in the second to eighth embodiments. This constitution is same as in the first embodiment.

The operation of thus constituted transmitter of digital portable cellular phone is same as in the first embodiment. According to the embodiment, therefore, by optimizing the phase value of the phase shifter inserted between the power amplifier and antenna, the isolator can be omitted, and smaller size, higher performance, and lower cost of the cellular phone may be realized.

Incidentally, in the sixth, seventh and eighth embodiments, transistors are provided in two stages, but by adding transistors to the input terminal side, multiple stages may be also composed.

The input matching circuit may not be absolutely needed in the sixth, seventh and eighth embodiments.

In the second embodiment, phase shifters differing in the phaseare inserted in the input to output units of n amplifiers, but instead of the phase shifters, it may be constituted to vary the phase of the output terminal and amplifier by providing the n-power divider and n-power combiner with the function of phase shifter.

Also in the second embodiment, the phase change amounts of each input to output of the n-power divider and n-power combiner are constant, but by using the n-power divider or n-power combiner differing in the phase change amount in each input to output, it may be also constituted to compensate for the phase change amount of each phase shifter.

As the n-power divider and n-power combiner in the second embodiment, meanwhile, Wilkinson power divider and 3 dB hybrid may be used.

As described herein, according to the invention, by minimizing the distortion of the output by adjusting the phase value of the phase shifter inserted between the power amplifier and antenna, using the power amplifier combining the outputs of plural power amplifiers differing individually in the phase of the output load impedance, using the power amplifier using a semiconductor device larger in output power than in first stage in the final stagedevice, and inserting the phase shifter setting to optimize the output load impedance of the power amplifier including the antenna impedance between it and the transmission antenna, it is possible to present a transmitter of portable wireless system capable of extending the region of output load impedance satisfying the specified value of unwanted radiation even by omitting isolator, so that smaller size, higher performance, and lower cost of portable cellular phone may b realized.

In the description of the foregoing embodiments of the inven tion, the digital cellular phone is presented, but it may be applied to different modulation method or further to non-portable wireless system although the portable wireless system demands such technical application most.

Numerical values and details of constitution in the illustrated embodiments are only examples, and may be hence varied within the scope of the invention.

As the invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A transmitter for a wireless system comprising:
   a digital modulator for modulating an input signal,
   a power amplifier for receiving an output of said digital modulator for amplification, said power amplifier having a first load impedance region,
   a phase shifter for receiving an amplified output of said power amplifier, and
   a transmission antenna for radiating an output of said phase shifter, said antenna having a second load impedance region,
   wherein said first load impedance region is shifted to more closely match said second load impedance region.

2. A transmitter of wireless system of claim 1, wherein the power amplifier comprises:
   an n-power divider having n outputs of same phase change amounts for one input,
   n input phase shifters for receiving the outputs of said n-power divider, of which phase change amounts are respectively $\phi 1, \phi 2, \ldots, \phi n$,
   n power amplifiers having same characteristics, for receiving the outputs of said n input phase shifters,
   n output phase shifters for receiving the corresponding outputs of said n power amplifiers corresponding to said input phase shifters, of which phase change amounts are respectively $(180°-\phi 1+\phi 0)$, $(180°-\phi 2+\phi 0)$, $\ldots$, $(180°-\phi n+\phi 0)$, with the fixed phase amount to be $\phi 0$, and
   an n-power combiner having same phase change amounts for n inputs from said n output phase shifters, and having one output by synthesizing n inputs.

3. A transmitter of wireless system of claim 2, wherein n is 2, and the condition of $(-45°\leq(\phi 1-\phi 2)\leq 45°)$ is satisfied, supposing the phase change amounts of the input phase shifters to be $\phi 1$ and $\phi 2$.

4. A transmitter of wireless system of claim 2, wherein n is 4, and a parallel connection is composed with the phase change amount of each input phase shifter being 22.5.

5. A transmitter of wireless system of claim 1, wherein the power amplifying device comprises:
   an input 3 dB hybrid possessing two inputs and two outputs, with phase change amount differing by 90° from one to other of two outputs,
   two input phase shifters satisfying the condition of $(-45°\leq(\phi 1-\phi 2)\leq 45°)$, supposing the phase change amounts to be $\phi 1$ and $\phi 2$, by receiving the outputs from said input 3 dB hybrid,
   two power amplifiers having same characteristics, for receiving the outputs of said two input phase shifters,
   two output phase shifters for receiving the corresponding outputs of said two power amplifiers corresponding to said two input phase shifters, of which phase change amounts are respectively $(180°-\phi 1+\phi 0)$ and $(180°-\phi 2+\phi 0)$, with the fixed phase amount to be $\phi 0$, and
   an output 3 dB hybrid possessing two input and two outputs, with phase change amount differing by 90° from one to other of two inputs, wherein one of two inputs of said input 3 dB hybrid is connected to an input terminal, other is terminated at an end resistance, one of two outputs having a phase change of 90° is connected to the input phase shifter ($\phi1$), the other is connected to the input phase shifter ($\phi2$), the output of said input phase shifter $\phi1$ is connected to the input of the output phase shifter ($180°-\phi1+\phi0$) and the output of said input phase shifter $\phi2$ is connected to the input of the output phase shifter ($180°-\phi2+\phi0$) through the power amplifiers respectively, one output of the output 3 dB hybrid is terminated at a termination resistance, the other output is connected to the output terminal, the output of the output phase shifter ($180°-\phi2+\phi0$) is connected to the input having phase change of 90° of the output 3 dB hybrid, and the output of the output phase shifter ($180°-\phi1+\phi0$) is connected to the other input of the output 3 dB hybrid, thereby satisfying the condition of ($-135°\leq(\phi1-\phi2)\leq-45°$).

6. A transmitter of wireless system of claim 1, wherein the power amplifying device comprises:

an input matching circuit having one end connected to an input terminal, a first stage transistor connected to the output of said input matching circuit, an interstage matching circuit connected to the output of said first stage transistor, a final stage transistor connected to the output of said interstage matching circuit, and an output matching circuit connected to the output of said final stage transistor, wherein in the applicable frequency band supposing the gain of the final stage transistor at the point of 1 dB compression of gain due to saturation of output power to be Gp, the final stage transistor is selected so that it has a larger output power at 1 dB gain compression point than the power of adding gain Gp to the output power at 1 dB gain compression point of the first stage transistor.

7. A transmitter of wireless system of claim 6, wherein the input matching circuit, interstage matching circuit, output matching circuit, first stage transistor, and final stage transistor are composed in a monolithic microwave integrated circuit.

8. A transmitter of wireless system of claim 6, wherein the input matching circuit, interstage matching circuit, first stage transistor, and final stage transistor are composed in a monolithic microwave integrated circuit.

9. The transmitter of claim 1 wherein a load impedance value of said phase shifter is added to a load impedance value in said second load impedance region for substantially matching a load impedance value in said first impedance region.

10. The transmitter of claim 1 wherein said first load impedance region is shifted to substantially overlie said second load impedance region.

* * * * *